(12) United States Patent
Chen

(10) Patent No.: US 8,803,320 B2
(45) Date of Patent: Aug. 12, 2014

(54) INTEGRATED CIRCUITS AND FABRICATION METHODS THEREOF

(75) Inventor: Chung-Hui Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 236 days.

(21) Appl. No.: 13/025,763

(22) Filed: Feb. 11, 2011

(65) Prior Publication Data

US 2012/0104569 A1 May 3, 2012

Related U.S. Application Data

(60) Provisional application No. 61/407,509, filed on Oct. 28, 2010.

(51) Int. Cl.
*H01L 29/40* (2006.01)
(52) U.S. Cl.
USPC ....... 257/758; 257/776; 257/662; 257/E23.17
(58) Field of Classification Search
CPC .............. H01L 23/5225; H01L 23/528; H01L 23/5221; H01L 23/5286
USPC .............................. 257/758, 776, 662, E23.17
See application file for complete search history.

(56) References Cited

U.S. PATENT DOCUMENTS

| 2007/0120261 A1* | 5/2007 | Ho ................................ 257/758 |
| 2009/0189725 A1* | 7/2009 | Ding et al. .................... 336/137 |
| 2009/0193380 A1* | 7/2009 | McElvain et al. ............... 716/12 |
| 2009/0237186 A1* | 9/2009 | Onda et al. .................... 333/238 |

FOREIGN PATENT DOCUMENTS

| JP | 62203351 | 9/1987 |
| JP | 2003-158186 | 5/2003 |

OTHER PUBLICATIONS

Merriam Webster Dictionary,http://www.merriam-webster.com/dictionary/edge, 2013 Merriam-Webster, Inc.*

* cited by examiner

*Primary Examiner* — Julia Slutsker
(74) *Attorney, Agent, or Firm* — Lowe Hauptman & Ham, LLP

(57) ABSTRACT

An integrated circuit includes a signal line routed in a first direction. A first shielding pattern is disposed substantially parallel with the signal line. The first shielding pattern has a first edge having a first dimension and a second edge having a second dimension. The first edge is substantially parallel with the signal line. The first dimension is larger than the second dimension. A second shielding pattern is disposed substantially parallel with the signal line. The second shielding pattern has a third edge having a third dimension and a fourth edge having a fourth dimension. The third edge is substantially parallel with the signal line. The third dimension is larger than the fourth dimension. The fourth edge faces the second edge. A first space is between the second and fourth edges.

20 Claims, 13 Drawing Sheets

INTEGRATED CIRCUITS AND FABRICATION METHODS THEREOF

CROSS-REFERENCE TO RELATED APPLICATIONS

The present application claims priority of U.S. Provisional Patent Application Ser. No. 61/407,509, filed on Oct. 28, 2010, which is incorporated herein by reference in its entirety.

TECHNICAL FIELD

The present disclosure relates generally to the field of semiconductor devices, and more particularly, to integrated circuits and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

As mentioned above, the trend in the semiconductor industry is towards the miniaturization or scaling of integrated circuits, in order to provide smaller ICs and improve performance, such as increased speed and decreased power consumption. While aluminum and aluminum alloys were most frequently used in the past for the material of conductive lines in integrated circuits, the current trend is to use copper for a conductive material because copper has better electrical characteristics than aluminum, such as decreased resistance, higher conductivity, and a higher melting point.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
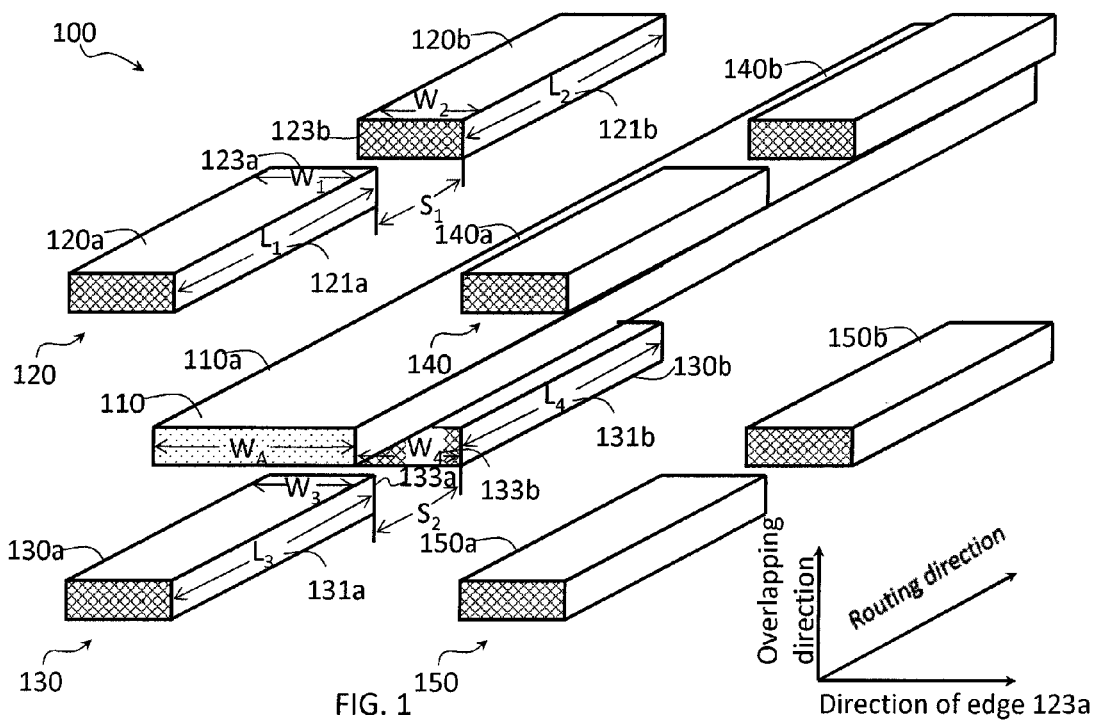
FIG. 1 is a schematic drawing illustrating an exemplary 3-dimension (3-D) structure of an integrated circuit.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic drawing illustrating an exemplary 3-dimension (3-D) structure of an integrated circuit. In FIG. 1, an integrated circuit 100 can include a signal line, e.g., a signal line 110, and a plurality of shielding structures, e.g., shielding structures 120-150. During operations, the shielding structures 120-150 can be grounded. The shielding structure 120-150 can be configured to reduce noises on the signal line 110 that are coupled from other signal lines and/or ground lines (not shown). In some embodiments, the signal line 110 can be disposed in a routing direction as shown in FIG. 1. The shielding structures 120-150 can be disposed substantially parallel with the signal line 110. In some embodiments, the signal line 110 and the shielding structures 120-150 can be disposed between two inverters, amplifiers, and/or inverters. In other embodiments, the integrated circuit 100 can be a double data rate (DDR) circuit, a low voltage differential signal (LVDS) circuit, or any high-speed analog circuit.

In some embodiments, the shielding structure 120 can include a plurality of shielding patterns, e.g., shielding patterns 120a and 120b. The shielding patterns 120a-120b can be disposed substantially parallel with the signal line 110. The shielding pattern 120a has edges 121a and 123a. The edge 121a and 123a can have dimensions $L_1$ and $W_1$, respectively. The edge 121a can be substantially parallel with the signal line 110. The edge 123a can be substantially perpendicular to the signal line 110. The dimension $L_1$ is larger than the dimension $W_1$. The shielding pattern 120b can have edges 121b and 123b. The edge 121b and 123b can have dimensions $L_2$ and $W_2$, respectively. The edge 121b can be substantially parallel with the signal line 110. The edge 123b can be substantially perpendicular to the signal line 110. The dimension $L_2$ is larger than the dimension $W_2$. The edge 123a faces the edge 123b. The edge 123a is distant from the edge 123b by a space $S_1$.

In some embodiments, the dimension $W_1$ can be substantially equal to the minimum dimension of the design rule of the metallic layer. In some embodiments, the dimension $L_1$ is about two times or more of the dimension $W_1$. In other embodiments, the width $W_A$ of the signal line 110 can be about 2 times or more of the dimension $W_1$. In still other embodiments, the space $S_1$ can have a dimension of about 2 times or more of the dimension $W_1$. In yet still other embodiments, the space $S_1$ can have a dimension ranging from about the dimension $W_1$ and about 2 times of the dimension $W_1$.

Referring again to FIG. 1, the edge 121a is substantially parallel with the routing direction. The direction of the edge 123a is substantially perpendicular to the routing direction. In some embodiments, the shielding pattern 120a and the signal line 110 can have an overlap of about 35% or less in the overlapping direction that is substantially perpendicular to the routing direction and the direction of the edge 123a. In other embodiments, the edge 121a can be substantially aligned with an edge 110a of the signal line 110 in the overlapping direction.

Referring to FIG. 1, the shielding structure 130 can include a plurality of shielding patterns, e.g., shielding patterns 130a and 130b. The shielding patterns 130a-130b can be disposed substantially parallel with the signal line 110. The shielding pattern 130a can have edges 131a and 133a. The edge 131a and 133a can have dimensions $L_3$ and $W_3$, respectively. The edge 131a can be substantially parallel with the signal line 110. The edge 133a can be substantially perpendicular to the signal line 110. The dimension $L_3$ is larger than the dimension $W_3$. The shielding pattern 130b can have edges 131b and 133b. The edge 131b and 133b can have dimensions $L_4$ and $W_4$, respectively. The edge 131b can be substantially parallel with the signal line 110. The edge 133b can be substantially perpendicular to the signal line 110. The dimension $L_4$ is larger than the dimension $W_4$. The edge 133a faces the edge 133b. The edge 133a is distant from the edge 133b by a space $S_2$.

In some embodiments, the dimension $W_3$ can be substantially equal to the minimum dimension of the design rule of the metallic layer. In some embodiments, the dimension $L_3$ is about two times or more of the dimension $W_3$. In other embodiments, the width $W_4$ of the signal line 110 can be about 2 times or more of the dimension $W_3$. In still other embodiments, the space $S_2$ can have a dimension of about 2 times or more of the dimension $W_3$.

Referring again to FIG. 1, the edge 131a is substantially parallel with the routing direction. The direction of the edge 133a is substantially perpendicular to the routing direction. In some embodiments, the shielding pattern 130a and the signal line 110 can have an overlap of about 35% or less in the overlapping direction that is substantially perpendicular to the routing direction and the direction of the edge 133a. In other embodiments, the edge 131a can be substantially aligned with an edge 110a of the signal line 110 in the overlapping direction.

In some embodiments, the dimensions and/or spaces of the shielding structures 140 and 150 can be similar to those of the shielding structures 120 and 130. In other embodiments, the dimension and/or spaces of the shielding structures 140 and 150 may be modified and different from those of the shielding structure 120 and/or 130. Though the shielding structures 120-150 each merely show two shielding patterns in FIG. 1, the scope of the present application is not limited thereto. In some embodiments, the shielding structures 120-150 can each have more than two shielding patterns.

Figure 2:
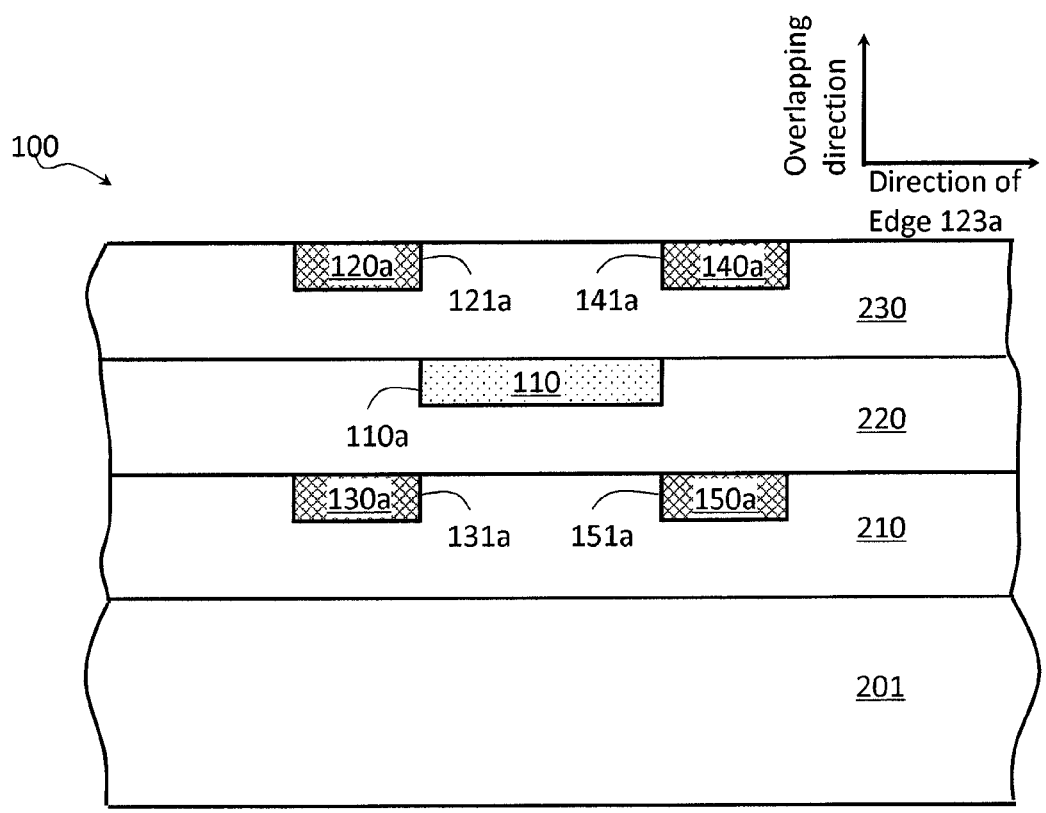
FIG. 2 is a schematic cross-sectional view of an exemplary integrated circuit shown in FIG. 1.

FIG. 2 is a schematic cross-sectional view of the integrated circuit 100 shown in FIG. 1. In FIG. 2, the integrated circuit 100 can be formed over a substrate 201. The substrate 201 can be a silicon substrate doped with a P-type dopant, such as boron (a P-type substrate). Alternatively, the substrate 201 could be another suitable semiconductor material. For example, the substrate 201 may be a silicon substrate that is doped with an N-type dopant, such as phosphorous or arsenic (an N-type substrate). The substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

In some embodiments, at least one passive device (not shown), e.g., capacitors, resistors, inductors, and/or other passive devices, and at least one active device (not shown), e.g., metal-oxide-semiconductor (MOS) transistors, bipolar junction transistors (BJTs), complementary MOS (CMOS) transistors, etc., can be disposed on and/or over the substrate 201.

In some embodiments, the shielding structures 120-150 can be disposed in a metallization layer that is different from the metallization layer in which the signal line 110 is disposed. For example, the shielding patterns 130a and 150a can be disposed in the metallization layer 210. The signal line 110 can be disposed in the metallization layer 220. The shielding patterns 120a and 140a can be disposed in the metallization layer 230. The metallization layer 220 adjoins the metallization layers 210 and 230. In some embodiments, the metallization layers 210-230 can each include at least one dielectric material layer. The dielectric material layer may include at least one material, such as silicon oxide, silicon nitride, silicon oxynitride, low dielectric constant (low-k) dielectric material, ultra low-k dielectric material, another dielectric material, or any combinations thereof.

In some embodiments, the metallization layers 210-230 can each accommodate at least one electrical connection structure (not shown). The electrical connection structure can include a via plug, a contact plug, a damascene structure, a dual damascene structure, a metallic region, a metallic lines, or any combinations thereof. The via plug, contact plug, damascene structure, dual damascene structure, metallic region, and metallic line can be made of at least one material, such as tungsten, aluminum, copper, titanium, tantalum, titanium nitride, tantalum nitride, nickel silicide, cobalt silicide, other proper conductive materials, and/or combinations thereof.

Figure 3:
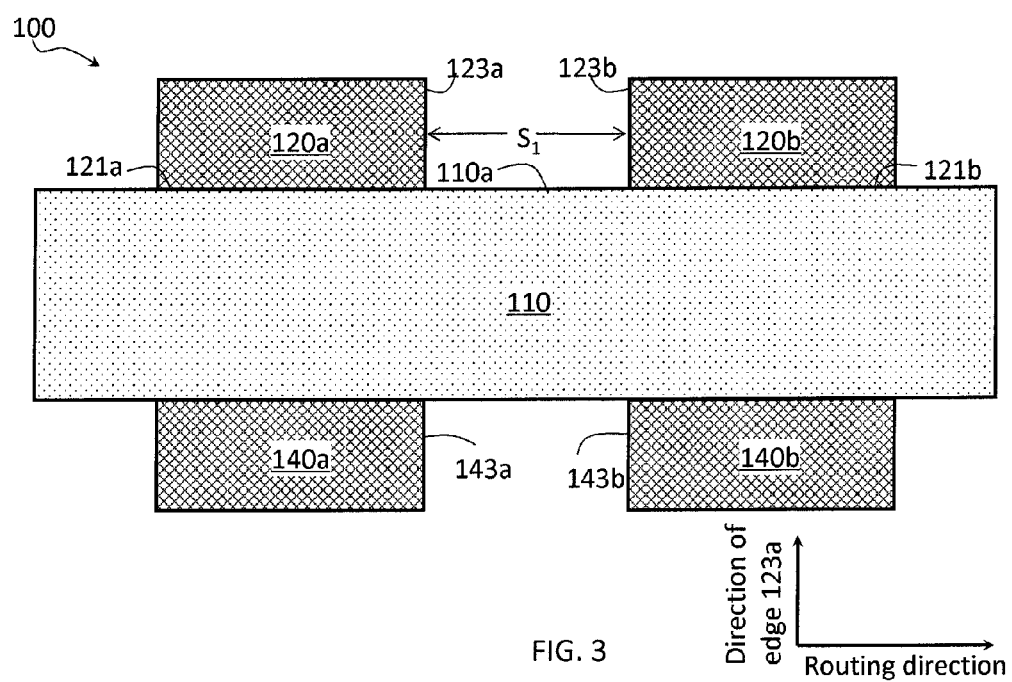
FIG. 3 is a schematic top view of an exemplary integrated circuit of FIG. 1.

FIG. 3 is a schematic top view of the integrated circuit 100 of FIG. 1. As shown in FIG. 3, the edges 121a and 121b can be substantially aligned with the edge 110a. In some embodiments, the edges 123a and 123b can be substantially aligned with edges 143a and 143b, respectively.

Figure 4:
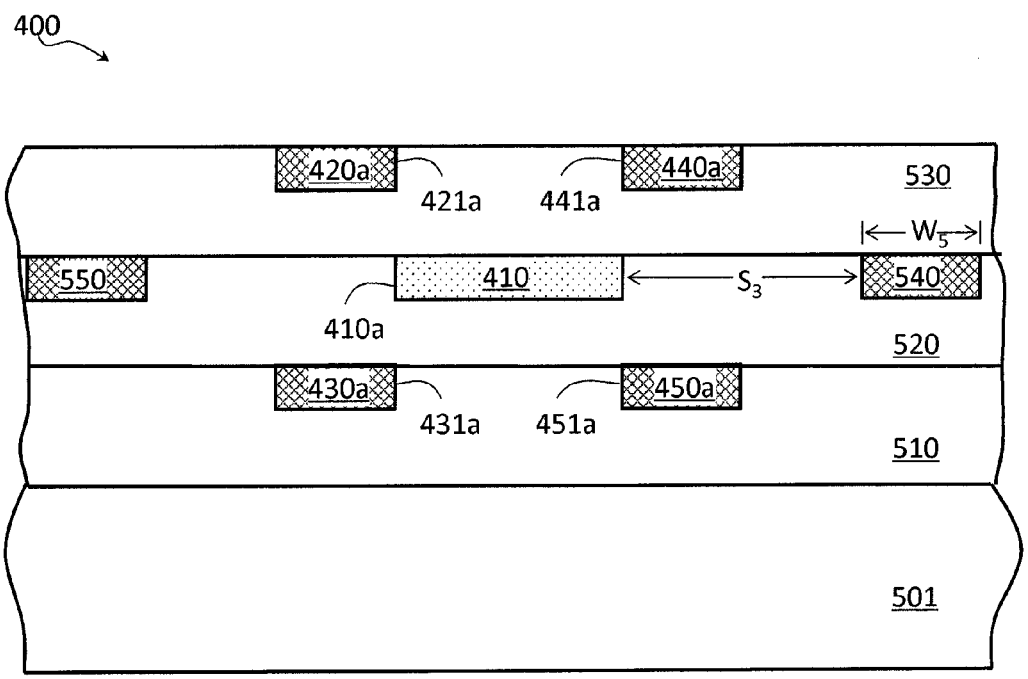
FIG. 4 is a schematic cross-sectional view of another exemplary integrated circuit.

FIG. 4 is a schematic cross-sectional view of another exemplary integrated circuit. Items of FIG. 4 that are the same or similar items in FIG. 2 are indicated by the same reference numerals, increased by 300. In FIG. 4, shielding structures 540-550 and a signal line 410 can be disposed in the same metallization layer 520. The shielding structures 540-550 can each be disposed adjacent to one side edge of a signal line 410. In some embodiments, the shielding structures 540-550 can each have a width $W_5$ that is similar to the dimension $W_1$ described above in conjunction with FIG. 1. In other embodiments, a space $S_3$ between the shielding structure 540 and the signal line 510 can be two times or more of the dimension $W_1$.

In some embodiments, the shielding structures 540-550 can each be similar to one of the shielding structures 120-150 described above in conjunction with FIG. 1. In other embodiments, the shielding structures 540-550 can continuously extend in the routing direction of the signal line 410. In still other embodiments, the shielding structures 540-550 can each have a length that is substantially equal to that of the signal line 410.

In some embodiments, a metallic shielding plate (not shown) can be disposed in a metallization layer that is over the metallization layer 530. In other embodiments, another metallic shielding plate (not shown) can be disposed in a metallization layer that is below the metallization layer 510. The metallic shielding plates can each have a width that is larger than the sum of the widths of the signal line 410 and the shielding patterns 420a and 440a.

Figure 5:
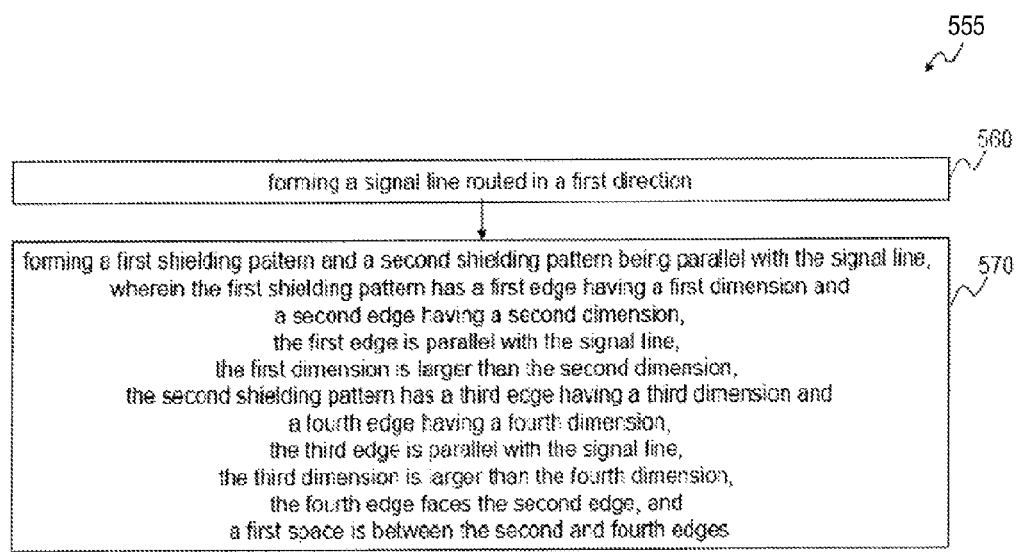
FIG. 5 is a flowchart of an example method for fabricating an integrated circuit.

Illustrated in FIG. 5 is a flowchart of an example method 555 for fabricating an integrated circuit. FIGS. 6A-6H are diagrammatic fragmentary cross-sectional side views of the integrated circuit during various fabrication stages. It is understood that FIGS. 6A-6H have been simplified for a better understanding of the inventive concepts of the present disclosure. Accordingly, it should be noted that additional processes may be provided before, during, and after the method 555 of FIG. 5, and that some other processes may only be briefly described herein.

Referring now to FIG. 5, the method 555 begins with block 560 in which a signal line is formed in a routing direction. The method 555 continues with block 570 in which a first shielding pattern and a second shielding pattern are formed in a parallel fashion with the signal line. The first shielding pattern has a first edge having a first dimension and a second edge having a second dimension. The first edge is substantially parallel with the signal line. The first dimension is larger than the second dimension. The second shielding pattern has a third edge having a third dimension and a fourth edge having a fourth dimension. The third edge is substantially parallel with the signal line. The third dimension is larger than the fourth dimension. The fourth edge faces the second edge. A first space is between the second and fourth edges.

Figure 6A:
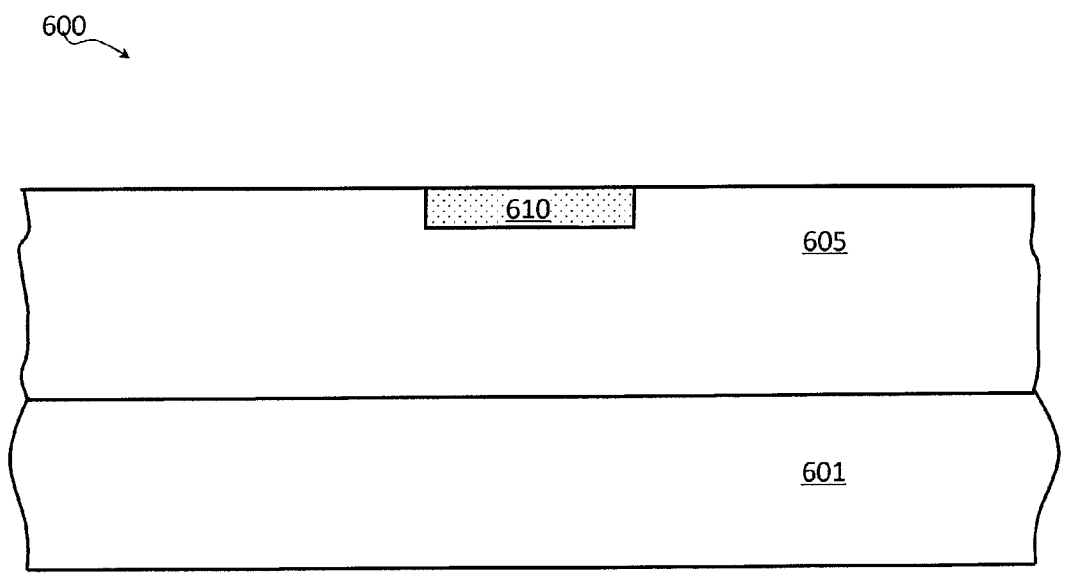
FIGS. 6A-6H are diagrammatic fragmentary cross-sectional side views of the integrated circuit during various fabrication stages.

Referring now to FIG. 5, a signal line is formed in a routing direction as shown in block 560. For example, a signal line 610 is formed in a routing direction as shown in FIG. 6A. In some embodiments, the signal line 610 can be formed in a metallization layer 605 that can be formed over a substrate 601. The substrate 601, the metallization layer 605, and the signal line 610 can be similar to the substrate 201, the metallization 220, and the signal line 110, respectively, described above in conjunction with FIG. 2.

Referring to FIG. 5, shielding patterns can be formed in a parallel fashion with the signal line as shown in block 570. For example, the shielding patterns 120a and 120b can be formed in a parallel fashion with the signal line 110 as described above in conjunction with FIG. 1. In some embodiments, the shielding patterns can be formed by a single photolithography/single etch (1P1E) process cooperated with a spacer formation technology as described below in conjunction with FIGS. 6B-6H. In other embodiments, the shielding patterns can be formed by a 2P2E process (a process of forming a pattern in a material layer through two photolithographic exposures and two etching processes). However, the cost of fabricating the integrated circuit 600 with the 1P1E process is lower than that with the 2P2E process.

Figure 6B:
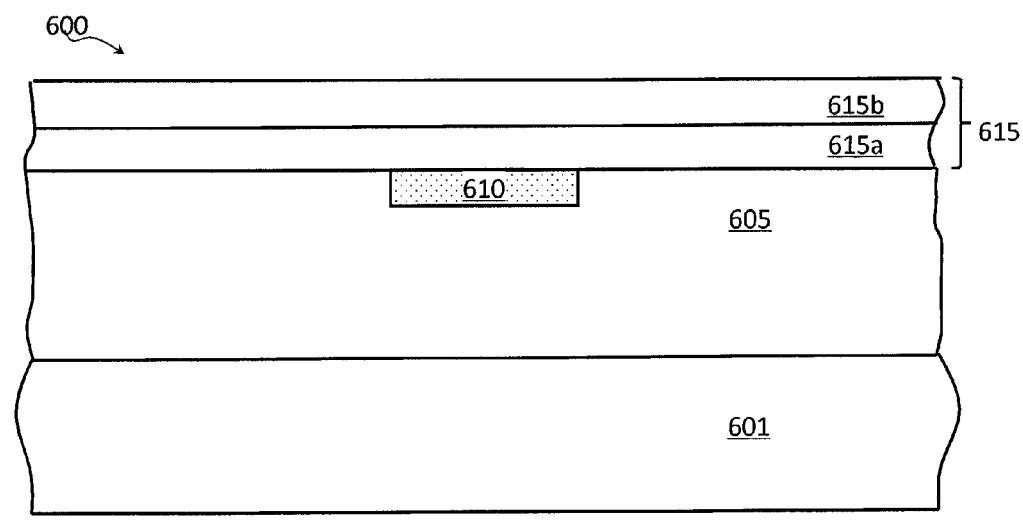

Referring to FIG. 6B, dielectric layers 615a-615b can be formed over the metallization layer 605. In some embodiments, the combination of the dielectric layers 615a-615b can be referred to as the dielectric material layer of the metallization layer 230 described above in conjunction with FIG. 2. The heights of the layers 615a and 615b can accommodate heights of vias and metallic lines, respectively, of electrical interconnection.

Figure 6C:
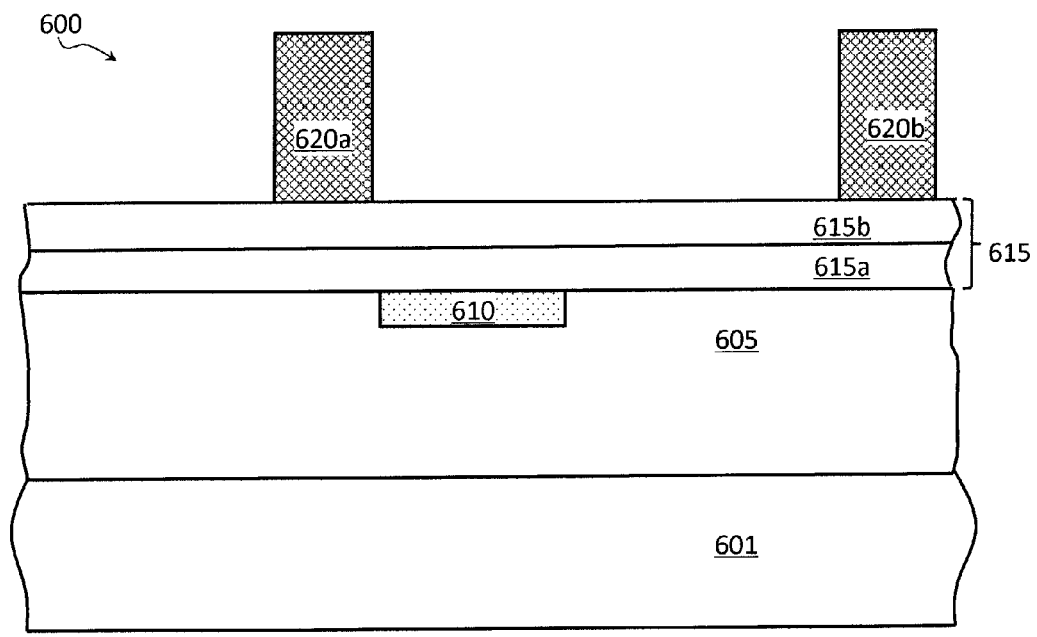

Referring to FIG. 6C, a photolithographic process can be performed to form patterned photoresist layers 620a and 620b over the dielectric layer 615b. In some embodiments, the space between the patterned photoresist layers 620a and 620b can be substantially larger than the minimum rule of metallic lines. Due to the large dimension, the concern of the photolithography limitation can be avoided.

Figure 6D:
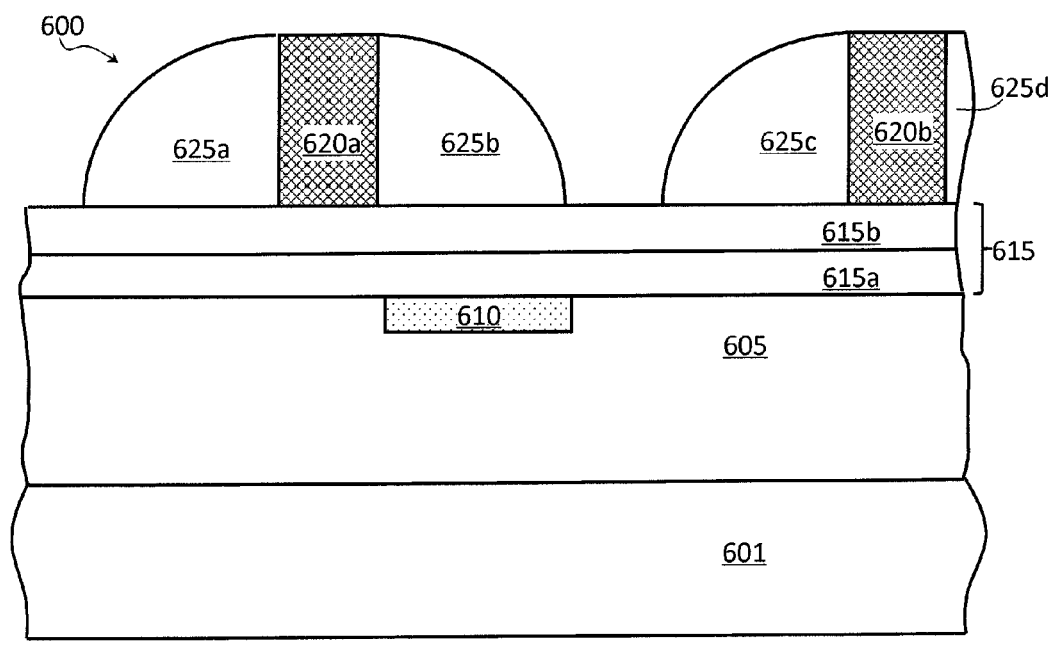

Referring to FIG. 6D, spacers 625a-625b and 625c-625d can be formed on sidewalls of the patterned photoresist layers 620a and 620b, respectively. In some embodiments, the spacers 625a-625d can be dielectric spacers that are made of at least one material, such as silicon oxide, silicon nitride, silicon oxynitride, other dielectric materials having an etching rate that is substantially different from the photoresist layers 620a and 620b, or any combinations thereof. In some embodiments, a space between the spacers 625b and 625c can be substantially equal to the width of the patterned photoresist layer 620a.

Figure 6E:
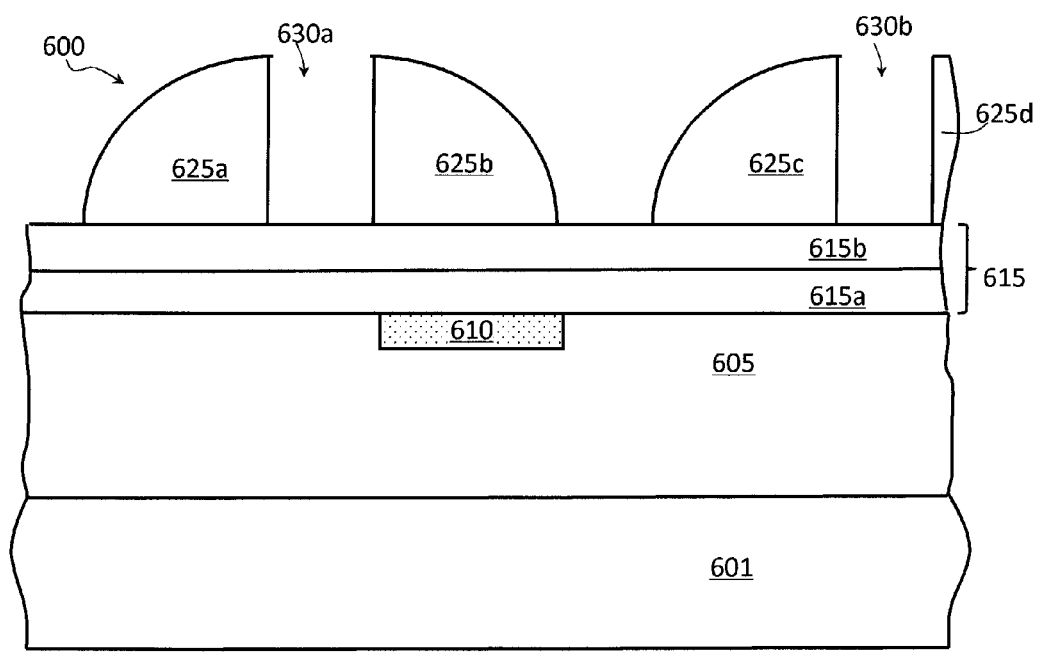

Referring to FIG. 6E, the patterned photoresist layers 620a and 620b are removed and openings 630a and 630b can be formed between the spacers 625a-625b and 625c-625d, respectively. In some embodiments, the process of the removing the patterned photoresist layers 620a and 620b can have an etching selectivity to the patterned photoresist layers 620a and 620b that is substantially larger than that of the spacers 625a-625d.

Figure 6F:
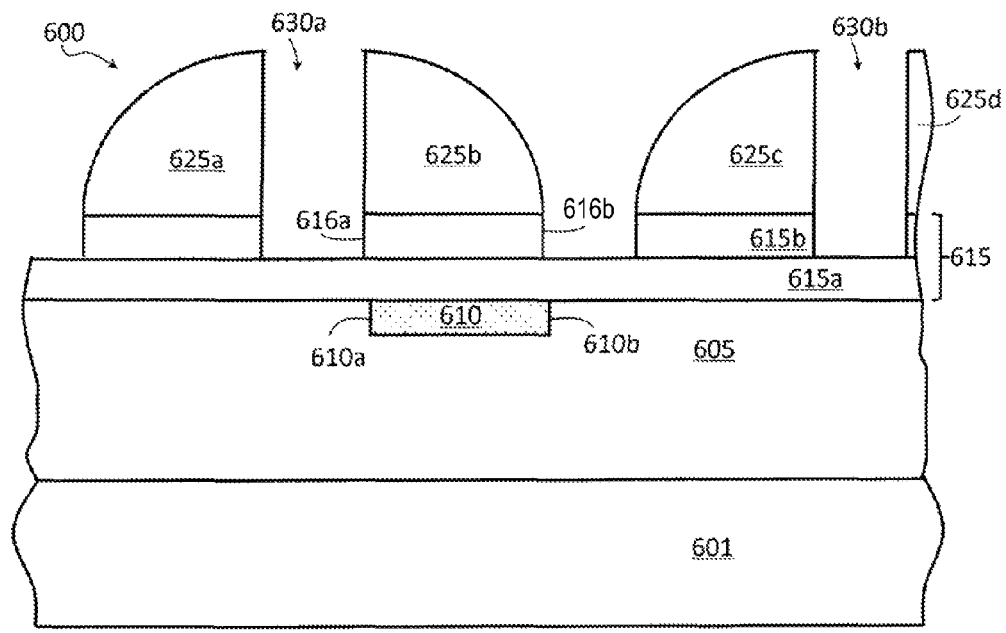

Referring to FIG. 6F, the spacers 625a-625d are used as a hard mask. A process is used to remove portions of the dielectric layer 615b. The process can include at least one of a dry etch process, a wet etch process, and/or any combinations thereof. In some embodiments, the etch process can have an etching selectivity to the dielectric layer 615b that is substantially larger than that of the spacers 625a-625d. In some embodiments, edges 616a-616b of the dielectric layer 615b can be substantially aligned with edges 610a-610b of the signal line 610.

Figure 6G:
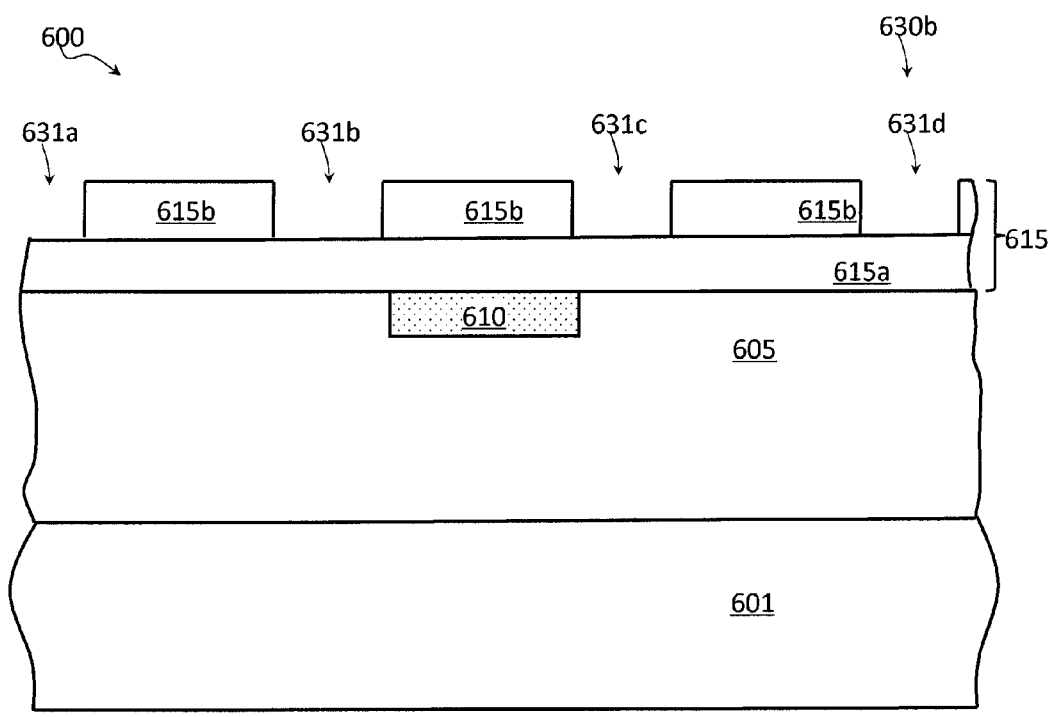

Referring to FIG. 6G, the spacers 625a-625d (shown in FIG. 6F) are removed. Openings 631a-631d are formed in the dielectric layer 615b. The process of removing the spacers 625a-625d can include at least one of a dry etch process, a wet etch process, and/or any combinations thereof.

Figure 6H:
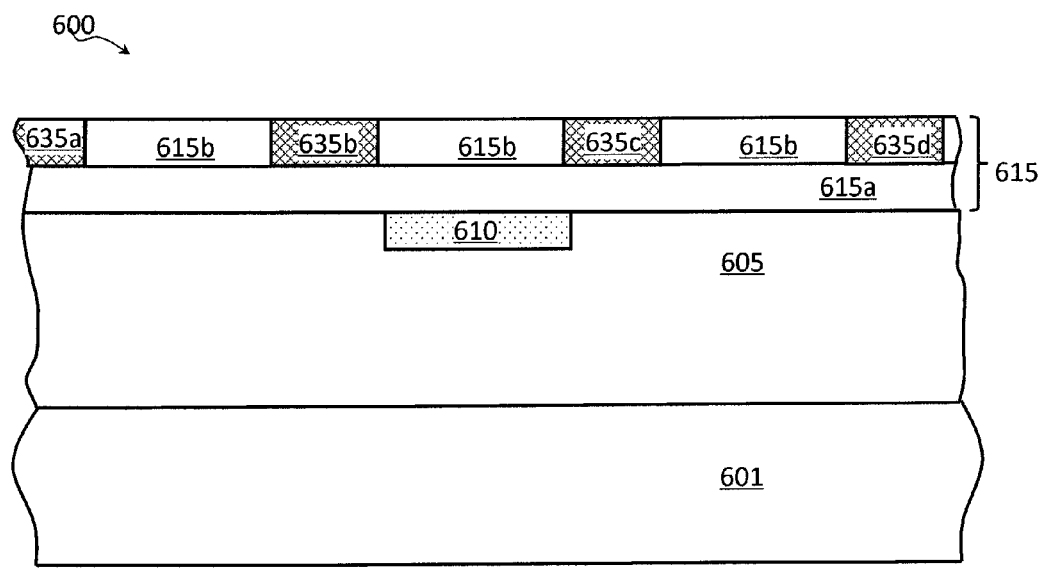

Referring to FIG. 6H, shielding patterns 635a-635d can be formed in the openings 631a-631d, respectively. The dimensions of the shielding patterns 635a-635d can be similar to those of the shielding patterns 120a-150a described above in conjunction with FIGS. 1-2. In some embodiments, the process of forming the shielding patterns 635a-635d can include, for example, a metallic layer (not shown) that can be formed by chemical vapor deposition (CVD), physical vapor deposition (PVD), or another suitable technique. A chemical-mechanical-polishing (CMP) process could be performed on the metallic layer so as to planarize the shielding patterns 635a-635d and the dielectric layer 615b. The shielding patterns 635b and 635c can provide shielding effect for the signal line 610 in a manner similar to that in which the shielding patterns 120a and 140a shield the signal line 110 described above in conjunction with FIGS. 1-2). In some embodiments, additional lower shielding patterns similar to the shielding patterns 130a and 150a described above in conjunction with FIGS. 1-2 can be added in the integrated circuit 60. Such lower shielding patterns can be formed before the signal line 110. Likewise, same-layer shielding patterns similar to the shielding patterns 540 and 550 described above in conjunction with FIG. 4 can be applied to the integrated circuit 600. Such same-layer shielding patterns can be formed substantially at the same time as the signal line 610.

It is noted that the processes for forming the shielding patterns 635a-635d described above in conjunction with FIGS. 6A-6H are merely exemplary. The scope of the present application is not limited thereto. In some embodiments, the shielding patterns 635a-635d can be formed by a single photolithography/single etch (1P1E) process. In other embodiments, the shielding patterns 635a-635d can be formed by a 2P2E process.

In a first exemplary embodiment, an integrated circuit includes a signal line routed in a first direction. A first shielding pattern is disposed substantially parallel with the signal line. The first shielding pattern has a first edge having a first dimension and a second edge having a second dimension. The first edge is substantially parallel with the signal line. The first dimension is larger than the second dimension. A second shielding pattern is disposed substantially parallel with the signal line. The second shielding pattern has a third edge having a third dimension and a fourth edge having a fourth dimension. The third edge is substantially parallel with the signal line. The third dimension is larger than the fourth dimension. The fourth edge faces the second edge. A first space is between the second and fourth edges.

In a secondary embodiment, an integrated circuit includes a signal line routed in a first direction. The signal line is disposed in a first metallization layer. A plurality of shielding structures are disposed substantially parallel with the signal line. The shielding structures are disposed in a second metallization layer that adjoins the first metallization layer. The shielding structures each have a plurality of shielding patterns. The shielding patterns are separated from each other by a space. The shielding patterns each have a first edge having a first dimension and a second edge having a second dimension. The first edge is substantially parallel with the signal line. The first dimension is larger than the second dimension.

In a third exemplary embodiment, a method of forming an integrated circuit includes forming a signal line routed in a first direction. A first shielding pattern and a second shielding pattern are formed and substantially parallel with the signal line. The first shielding pattern has a first edge having a first dimension and a second edge having a second dimension. The first edge is substantially parallel with the signal line. The first dimension is larger than the second dimension. The second shielding pattern has a third edge having a third dimension and a fourth edge having a fourth dimension. The third edge is substantially parallel with the signal line. The third dimension is larger than the fourth dimension. The fourth edge faces the second edge. A first space is between the second and fourth edges.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
a signal line routed in a first direction;
a first shielding pattern being disposed substantially parallel with the signal line, the first shielding pattern having a first edge having a first dimension along the first direction and a second edge having a second dimension along a second direction different from the first direction, the first dimension being larger than the second dimension; and
a second shielding pattern being disposed substantially parallel with the signal line, the second shielding pattern having a third edge having a third dimension along the first direction and a fourth edge having a fourth dimension along the second direction, the third dimension being larger than the fourth dimension, the fourth edge facing the second edge in the first direction, and the first and second shielding patterns being separated by a dielectric material in the first direction.

2. The integrated circuit of claim 1, wherein the first dimension is about 2 times or more of the second dimension.

3. The integrated circuit of claim 1, wherein a first space between the first and second shielding patterns has a dimension that is about 2 times or more of the second dimension.

4. The integrated circuit of claim 1, wherein the signal line has a width of about 2 times or more of the second dimension.

5. The integrated circuit of claim 1, wherein the first shielding pattern and the signal line have an overlap of about 35% or less in a third direction, and the third direction is substantially perpendicular to the first direction and the second direction.

6. The integrated circuit of claim 1, wherein the signal line is disposed in a first metallization layer, the first and second shielding patterns are disposed in a second metallization layer that is different from the first metallization layer, and the first metallization layer adjoins the second metallization layer.

7. The integrated circuit of claim 6, further comprising:
a third shielding pattern being disposed substantially parallel with the signal line, the third shielding pattern having a fifth edge having a fifth dimension along the first direction and a sixth edge having a sixth dimension along the second direction, the fifth dimension being larger than the sixth dimension; and
a fourth shielding pattern being disposed substantially parallel with the signal line, the fourth shielding pattern having a seventh edge having a seventh dimension along the first direction and an eighth edge having an eighth dimension along the second direction, the seventh dimension being larger than the eighth dimension, the eighth edge facing the sixth edge in the first direction, a second space being between the sixth and eighth edges, wherein the third and fourth shielding patterns are disposed in a third metallization layer that is different from the first and second metallization layers, and the third metallization layer adjoins the first metallization layer.

8. The integrated circuit of claim 6, further comprising:
a first shielding structure disposed adjacent to a first side edge of the signal line; and
a second shielding structure disposed adjacent to a second side edge that is opposite to the first side edge, wherein the first and second shielding structures are disposed in the first metallization layer.

9. An integrated circuit comprising:
a signal line routed in a first direction, the signal line being disposed in a first metallization layer; and
a plurality of shielding structures disposed substantially parallel with the signal line, the shielding structures being disposed in a second metallization layer that adjoins the first metallization layer, the shielding structures each having a plurality of shielding patterns, the shielding patterns each having a first edge having a first dimension along the first direction and a second edge having a second dimension along a second direction different from the first direction, the first dimension being larger than the second dimension, and at least two of the shielding patterns being separated from each other in the first direction by a dielectric material.

10. The integrated circuit of claim 9, wherein the first dimension is about 2 times or more of the second dimension.

11. The integrated circuit of claim 9, wherein a space between the at least two shielding patterns has a dimension that is about 2 times or more of the second dimension.

12. The integrated circuit of claim 9, wherein the signal line has a width of about 2 times or more of the second dimension.

13. The integrated circuit of claim 9, wherein each of the shielding patterns and the signal line have an overlap of about 35% or less in a third direction, and the third direction is substantially perpendicular to the first direction and the second direction.

14. A method of forming an integrated circuit, the method comprising:

forming a signal line routed in a first direction; and forming a first shielding pattern and a second shielding pattern being substantially parallel with the signal line, wherein the first shielding pattern has a first edge having a first dimension along the first direction and a second edge having a second dimension along a second direction different from the first direction, the first dimension is larger than the second dimension, the second shielding pattern has a third edge having a third dimension along the first direction and a fourth edge having a fourth dimension along the second direction, the third dimension is larger than the fourth dimension, the fourth edge faces the second edge in the first direction, and the first and second shielding patterns are separated by a dielectric material in the first direction.

15. The method of claim 14, wherein the first dimension is about 2 times or more of the second dimension.

16. The method of claim 14, wherein a first space between the first and second shielding patterns has a dimension that is about 2 times or more of the second dimension.

17. The method of claim 14, wherein the signal line has a width of about 2 times or more of the second dimension.

18. The method of claim 14, wherein the first shielding pattern and the signal line have an overlap of about 35% or less in a third direction, and the third direction is substantially perpendicular to the first direction and the second direction.

19. The method of claim 14, wherein the signal line is disposed in a first metallization layer, the first and second shielding patterns are disposed in a second metallization layer that is different from the first metallization layer, and the first metallization layer adjoins the second metallization layer.

20. The method of claim 19, further comprising:

a third shielding pattern being disposed substantially parallel with the signal line, the third shielding pattern having a fifth edge having a fifth dimension along the first direction and a sixth edge having a sixth dimension along the second direction, the fifth dimension being larger than the sixth dimension; and a fourth shielding pattern being disposed substantially parallel with the signal line, the fourth shielding pattern having a seventh edge having a seventh dimension along the first direction and an eighth edge having an eighth dimension along the second direction, the seventh dimension being larger than the eighth dimension, the eighth edge facing the sixth edge in the first direction, and a second space being between the sixth and eighth edges, wherein the third and fourth shielding patterns are disposed in a third metallization layer that is different from the first and second metallization layers, and the third metallization layer adjoins the first metallization layer.

* * * * *